United States Patent
Van Itallie et al.

(10) Patent No.: US 6,670,109 B2
(45) Date of Patent: Dec. 30, 2003

(54) PHOTOLITHOGRAPHIC METHODS OF USING A SINGLE RETICLE TO FORM OVERLAPPING PATTERNS

(75) Inventors: John F. Van Itallie, Mechanicsville, VA (US); Erik Byers, Boise, ID (US)

(73) Assignee: Micron Technology, Inc., Boise, ID (US)

(*) Notice: Subject to any disclaimer, the term of this patent is extended or adjusted under 35 U.S.C. 154(b) by 98 days.

(21) Appl. No.: 09/943,186

(22) Filed: Aug. 29, 2001

(65) Prior Publication Data

US 2003/0044724 A1 Mar. 6, 2003

(51) Int. Cl.$^7$ ................................................. G03F 7/213
(52) U.S. Cl. ...................... 430/396; 430/311; 430/397
(58) Field of Search .................................. 430/311, 313, 430/394, 396, 397

(56) References Cited

U.S. PATENT DOCUMENTS 6,248,508 B1 * 6/2001 Murooka et al. ........... 430/394

* cited by examiner

*Primary Examiner*—Kathleen Duda
(74) *Attorney, Agent, or Firm*—Wells St. John P.S.

(57) ABSTRACT

The invention includes a photolithographic method in which overlapping first and second exposure patterns are formed on a photosensitive material from light passed through a single reticle. The first exposure pattern of the radiation comprises features separated by about a minimum feature spacing that can be accomplished with a single reticle exposure at the time of the photolithographic processing, and the overlapping first and second patterns comprise features separated by less than the minimum feature spacing. The invention also includes a photolithographic method of forming overlapping exposure patterns on a photosensitive material from light passed through a single reticle wherein the reticle is moved between a first exposure to a first light and a second exposure to a second light.

5 Claims, 9 Drawing Sheets

PHOTOLITHOGRAPHIC METHODS OF USING A SINGLE RETICLE TO FORM OVERLAPPING PATTERNS

TECHNICAL FIELD

The invention pertains to methods for exposing photosensitive material to patterned electromagnetic radiation.

BACKGROUND OF THE INVENTION

Photolithography is commonly used during formation of integrated circuits on semiconductor wafers. More specifically, a form of radiant energy (such as, for example, ultraviolet light) is passed through a radiation-patterning tool and onto a semiconductor wafer. The radiation-patterning tool can be, for example, a photomask or a reticle, with the term "photomask" traditionally being understood to refer to masks which define a pattern for an entirety of a wafer, and the term "reticle" traditionally being understood to refer to a patterning tool which defines a pattern for only a portion of a wafer. However, the terms "photomask" (or more generally "mask") and "reticle" are frequently used interchangeably in modern parlance, so that either term can refer to a radiation-patterning tool that encompasses either a portion or an entirety of a wafer. For purposes of interpreting the claims that follow, the terms photomask and reticle are to be understood to be utilized with their traditional meanings.

Radiation-patterning tools contain light restrictive regions (for example, totally opaque or attenuated/half-toned regions) and light transmissive regions (for example, totally transparent regions) formed in a desired pattern. A grating pattern, for example, can be used to define parallel-spaced conductive lines on a semiconductor wafer. The wafer is provided with a layer of photosensitive resist material commonly referred to as photoresist. Radiation passes through the radiation-patterning tool onto the layer of photoresist and transfers the mask pattern to the photoresist. The photoresist is then developed to remove either the exposed portions of photoresist for a positive photoresist or the unexposed portions of the photoresist for a negative photoresist. The remaining patterned photoresist can then be used as a mask on the wafer during a subsequent semiconductor fabrication step, such as, for example, ion implantation or etching relative to materials on the wafer proximate the photoresist.

Advances in semiconductor integrated circuit performance have typically been accompanied by a simultaneous decrease in integrated circuit device dimensions and a decrease in the dimensions of conductor elements which connect those integrated circuit devices. The demand for ever smaller integrated circuit devices brings with it demands for ever-decreasing dimensions of structural elements, and ever-increasing requirements for precision and accuracy in radiation-patterning with reticles and photomasks.

It would be desirable to develop improved methods for forming decreased circuit device dimensions for integrated circuit devices, and to develop improved methods for utilizing radiation-patterning tools.

SUMMARY OF THE INVENTION

In one aspect, the invention encompasses a photolithographic method in which overlapping first and second exposure patterns are formed on a photosensitive material from light passed through a single reticle. The first exposure pattern of the radiation comprises features separated by about a minimum feature spacing that can be accomplished with a single reticle exposure at the time of the photolithographic processing, and the overlapping first and second patterns comprise features separated by less than the minimum feature spacing.

In another aspect, the invention encompasses a photolithographic method of forming overlapping exposure patterns on a photosensitive material from light passed through a single reticle wherein the reticle is moved between a first exposure to a first light and a second exposure to a second light.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
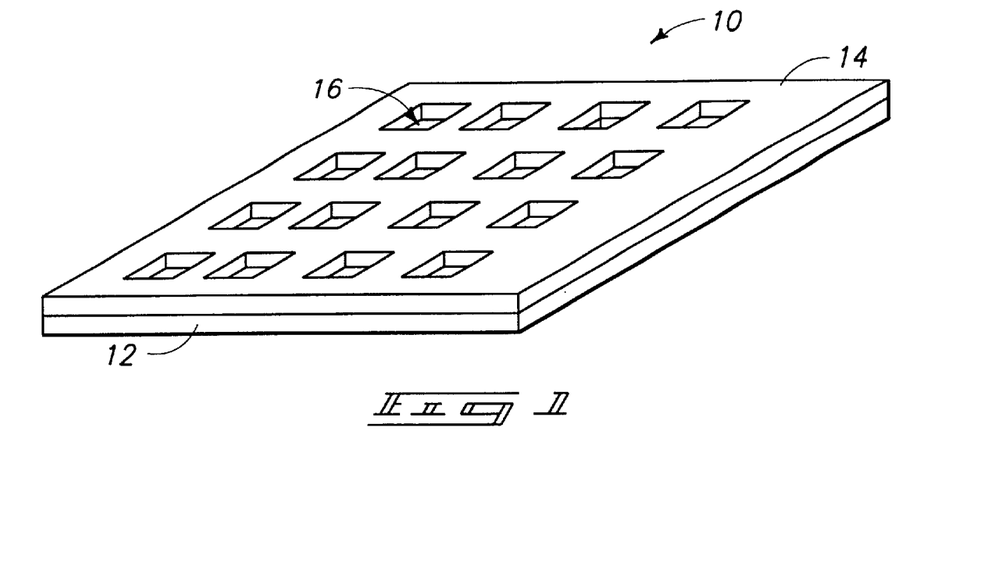
FIG. 1 is a diagrammatic, isometric view of a reticle.

A reticle 10 which can be utilized in methodology of the present invention is illustrated in FIG. 1. Reticle 10 comprises a transparent substrate 12 which can include, for example, glass. An opaque material 14 is formed over transparent substrate 12, and can comprise, for example, chromium. Openings 16 (only one of which is labeled) extend through opaque material 14, and terminate on a surface of transparent substrate 12. In the shown embodiment, all of the openings 16 are identical to one another, and accordingly a pattern of the openings formed across reticle 10 can be considered to consist of a unit feature (specifically, a single opening 16) which is repeated a plurality of times to define the pattern.

Reticle 10 can be formed by conventional methods. Such methods comprise a minimum spacing which can be achieved between adjacent features. For instance, there will be a minimum spacing which can be achieved between adjacent openings 16 due to limitations of a fabrication process utilized in forming reticle 10, and also due to physical limitations imposed by the wavelength of light that is ultimately to be patterned with reticle 10. Specifically, if adjacent features are formed too close to one another, interference will result from light passed through the features which can destroy various aspects of a radiation pattern that is desired to be formed with the reticle. To the extent that a minimum distance between device features is dictated by difficulties in a fabrication process, such minimum distance is decreasing over time as improvements are made in fabrication processes. However, to the extent that a minimum distance is dictated by physical limitations imposed by a particular wavelength of light, such difficulty cannot be overcome by improvements in fabrication processes. Regardless of the reason for which a minimum spacing between adjacent features exists, it is recognized that there is always a minimum spacing between adjacent features which is achievable by any given reticle-fabrication process. Typically, such minimum distance ultimately imposes a limitation on the minimum distance between adjacent structures formed when utilizing a reticle to pattern radiation. One aspect of the present invention is methodology which overcomes such limitation on the minimum distance between adjacent structures formed when utilizing a reticle to pattern radiation.

Figure 2:
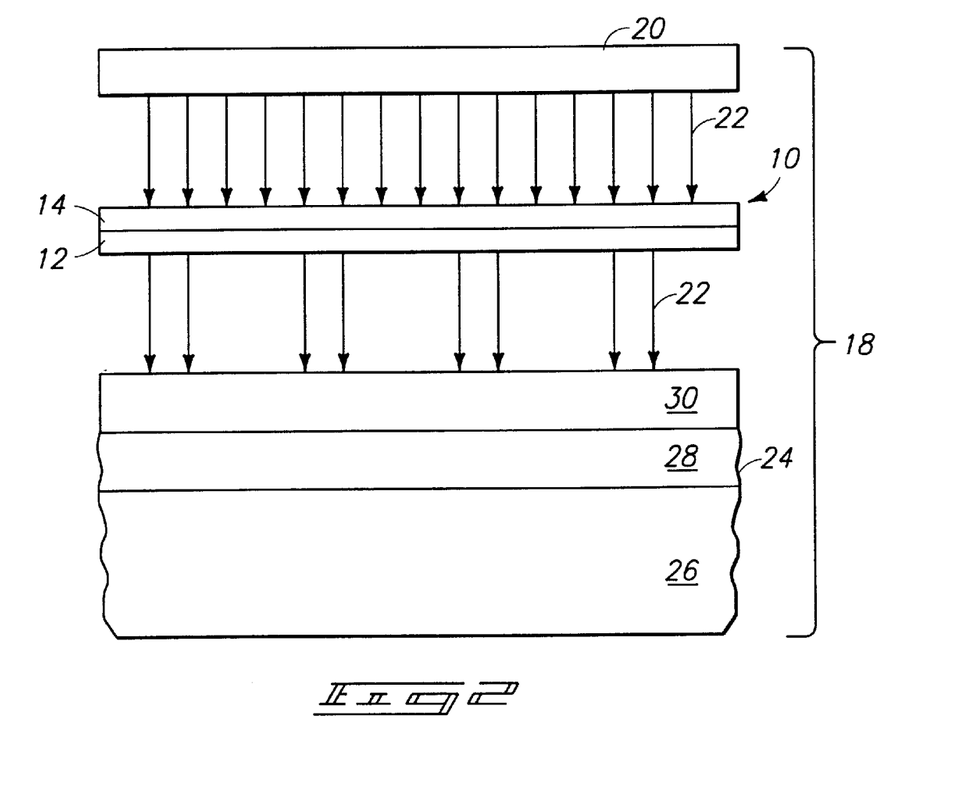
FIG. 2 is a diagrammatic side-view of a reticle being utilized to pattern radiation, and further illustrating the patterned radiation impacting a photosensitive material associated with a semiconductor substrate.

FIG. 2 illustrates an assembly 18 utilizing reticle 10 to pattern a beam of radiation. Specifically, FIG. 2 illustrates a radiation source 20 from which radiation 22 (illustrated by downwardly extending arrows, only one of which is labeled) is directed toward reticle 10. Reticle 10 patterns the radiation, and accordingly radiation 22 has a different pattern after passing through reticle 10 than before entering the reticle.

A semiconductor wafer fragment 24 is illustrated under reticle 10. Wafer fragment 24 comprises a substrate 26, which can comprise, for example, monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A material 28 is shown over substrate 26. Material 28 can comprise an insulative material, conductive material, and/or semiconductor material, as will be recognized by persons of ordinary skill in the art. In a particular fabrication process, material 28 can comprise an insulative material, such as, for example, borophosphosilicate glass.

A photosensitive material 30 is over material 28. Photosensitive material 30 can comprise, for example, either negative photoresist or positive photoresist.

Figures 3, 4, 5:
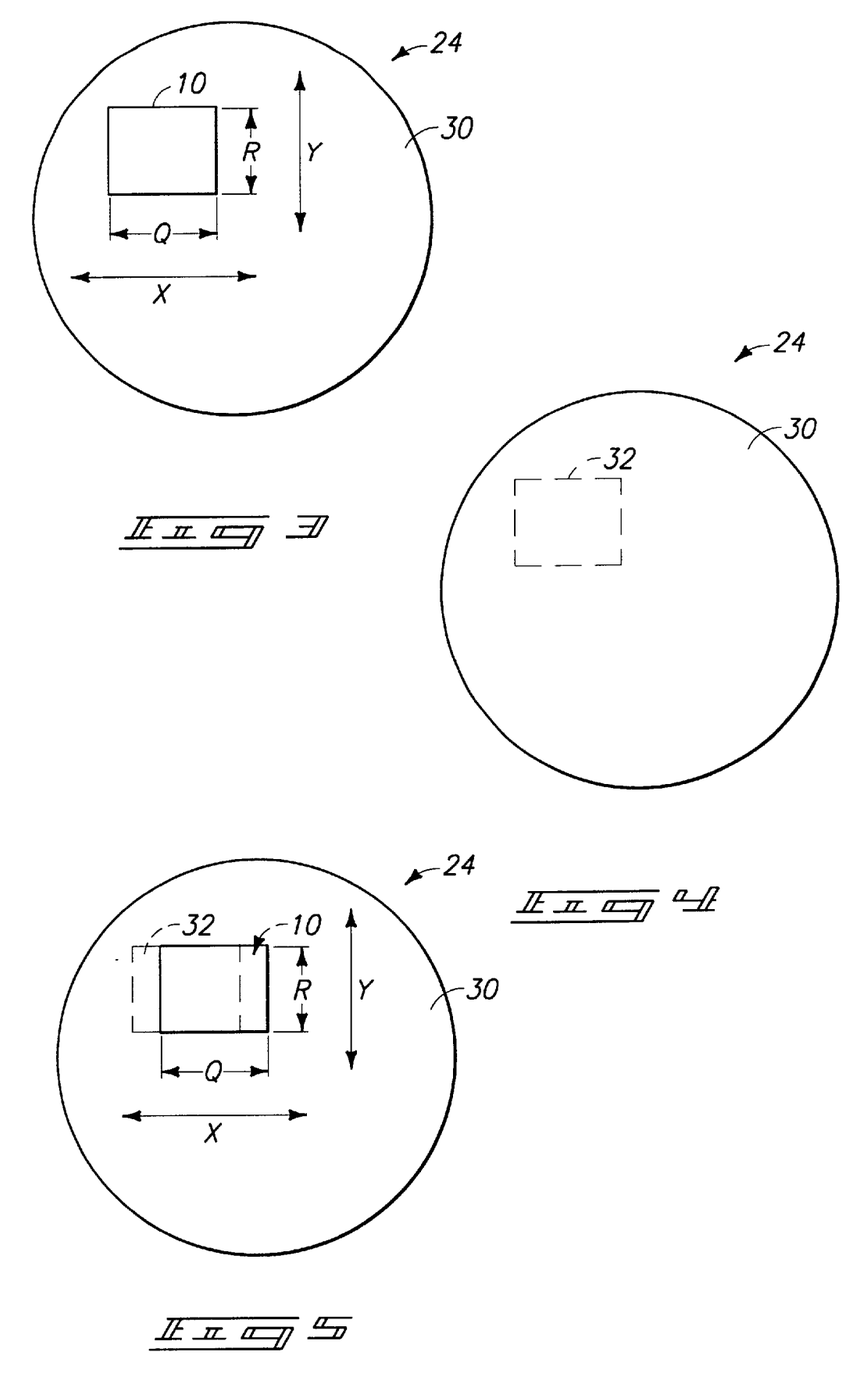
FIG. 3 is a diagrammatic top view of a reticle superimposed above a surface of a semiconductor wafer.
FIG. 4 is a diagrammatic view of the FIG. 3 wafer illustrating a portion of the wafer which has been exposed to radiation passed through the reticle illustrated in FIG. 3.
FIG. 5 is a view of the FIG. 3 wafer shown at a processing step subsequent to that of FIG. 4, and specifically shown with the reticle of FIG. 3 offset relative to the radiation pattern shown in FIG. 4.

FIG. 3 illustrates semiconductor material wafer 24 at a processing step encompassed by a method of the present invention. Reticle 10 is shown over wafer 24, and is shown to comprise the rectangular shape shown in FIG. 1. It is to be understood, however, that the invention can comprise reticles having shapes other than the shown rectangular shape. Reticle 10 would typically be elevated above wafer 24, and held in position relative to wafer 24 by a photolithographic processing apparatus (not shown) to form the assembly 18 described with reference to FIG. 3. Further, reticle 10 would comprise a pattern of openings formed therein, such as, for example, the openings 16 shown in FIG. 1. Such openings are not illustrated in FIG. 3 in order to simplify the illustration and the discussion that follows.

An axis "X" is illustrated relative to wafer 24, and an axis "Y" is illustrated extending orthogonal to the axis "X". Reticle 10 is illustrated to comprise a first dimension "Q" along axis "X" and a second dimension "R" along axis "Y".

Referring to FIG. 4, such illustrates wafer fragment 24 after radiation has passed through reticle 10 to form a patterned region 32 on the photosensitive material 30. Reticle 10 would typically remain over wafer 24 after the exposure of region 32, but reticle 10 is not shown in FIG. 4 in order to simplify the drawing. Patterned region 32 will comprise portions of material 30 which have been exposed to radiation (described with reference to FIG. 7 as portions 50) and other portions of material 30 which have not been exposed to radiation (described with reference to FIG. 7 as a portion 52). The exposed and unexposed portions of material 30 are not specifically illustrated in FIG. 4 in order to simplify the diagram.

FIG. 5 illustrates wafer 24 at a processing step subsequent to that of FIGS. 3 and 4. Specifically, reticle 10 is shown after the reticle has been displaced along axis "X" by an increment less than dimension "Q". It is to be understood that the movement of reticle 10 relative to wafer 24 can be accomplished by physical movement of either reticle 10, wafer 24, or both reticle 10 and wafer 24. The displacement of reticle 10 can be accomplished by a mechanism (not shown) supporting reticle 10 and wafer 24. Typically, such mechanism can comprise a stepper (also referred to as a scanner) which is capable of moving a reticle accurately to within a distance of 10 nanometers or less.

Reticle 10 can be considered to comprise a reticle field, with a maximum size of such field being generally limited by the exposure tool utilized. Multiple repeating die patterns are typically provided within the reticle field. For instance a 4×3 reticle field can comprise three repeating die patterns along the "R" dimension and 4 repeating die patterns along the Q dimension, for a total of 12 repeating die patterns in the reticle field. In particular aspects of the invention, the die patterns can be divided amongst two or more non-identical subsets. For instance, if four die patterns are formed along the Q dimension and 3 die patterns are formed along the R dimension, the leftmost 6 die patterns (i.e., the leftmost 2×3 pattern resulting from the left half of dimension "Q" and the entirety of dimension "R") can be identical to one another to define a first subset and the rightmost 6 die patterns (i.e., the rightmost 2×3 pattern resulting from the right half of dimension "Q" and the entirety of dimension "R") can be identical to one another to define a second subset. The first and second subsets can be exposed onto a wafer substrate. The reticle can then be shifted by half the length of dimension "Q" to overlay the second subset of a second exposure on the first subset of a first exposure.

Figure 6:
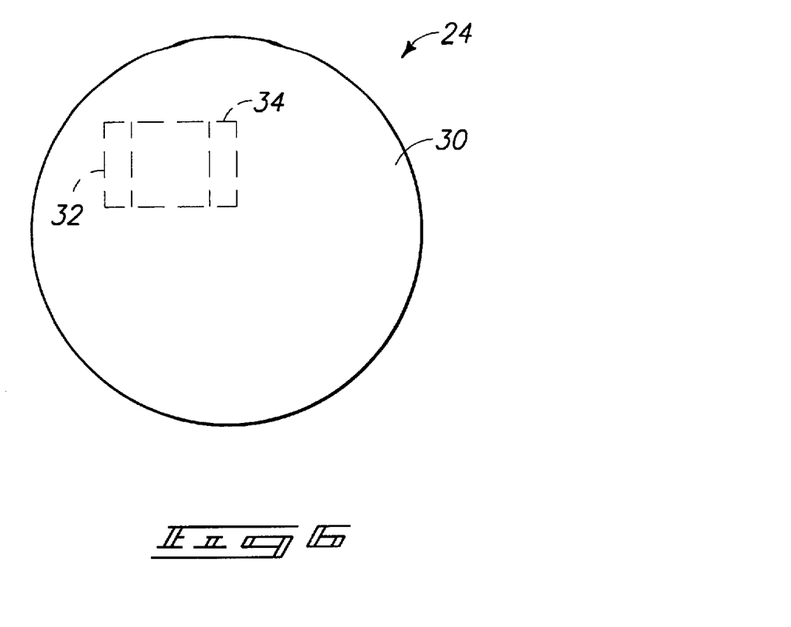
FIG. 6 is a view of the FIG. 3 wafer fragment illustrating a radiation pattern formed from the reticle of FIG. 5, and shown juxtaposed with the radiation pattern described with reference to FIG. 4.

Referring to FIG. 6, wafer 24 is illustrated after radiation has been passed through reticle 10 to form a second patterned region 34. FIG. 6, like the above-described FIG. 4, is shown without reticle 10 in order to simplify the drawing. Patterned region 34 will comprise portions of material 30 which have been exposed to radiation (described with reference to FIG. 8 as portions 70) and other portions of material 30 which have not been exposed to radiation (described with reference to FIG. 8 as a portion 52). The exposed and unexposed portions of material 30 are not specifically illustrated in FIG. 6 in order to simplify the diagram.

Exposed portions 32 and 34 can be considered to comprise overlapping exposure patterns on photosensitive material 30 which were formed from light passed through the single reticle 10 (FIG. 5). Exposure pattern 34 is offset relative to exposure pattern 32, and yet overlaps with exposure pattern 32. In particular embodiments, the light utilized to form exposure pattern 32 will have the same wavelength as that utilized to form exposure pattern 34. However, it is to be understood the invention can also encompass embodiments in which the light utilized to form exposure 32 has a different wavelength than the light utilized to form exposure pattern 34.

Although reticle 10 is described in FIGS. 3–6 as being displaced along the first axis "X", it is to be understood that the invention encompasses other embodiments wherein reticle 10 is displaced along the second axis "Y" in addition to, or alternatively to, being moved along the first axis "X". Further, it is to be understood that reticle 10 can be displaced along axis "Y" by an increment which is less than the dimension "R" of the reticle, and accordingly can form patterns which overlap along a "Y"-axis direction, as well as, or in addition to, overlapping along a "X" axis direction. Further, it is to be understood that reticle 10 can be displaced along an axis other than the illustrated axes "X" and "Y".

The amount by which second exposure pattern 34 overlaps first exposure pattern 32 can be varied for particular applications. In exemplary processing, at least 20% of second exposure pattern 34 overlaps first exposure pattern 32; in other exemplary processing, at least 30% of second exposure pattern 34 overlaps first exposure pattern 32; in yet other processing, from at least about 20% of second exposure pattern 34 to about 50% of second exposure pattern 34 overlaps first exposure pattern 32. In other exemplary processing, the amount of overlap of second exposure pattern 34 on first exposure pattern 32 is from at least about 20% to about 80%.

Figure 7:
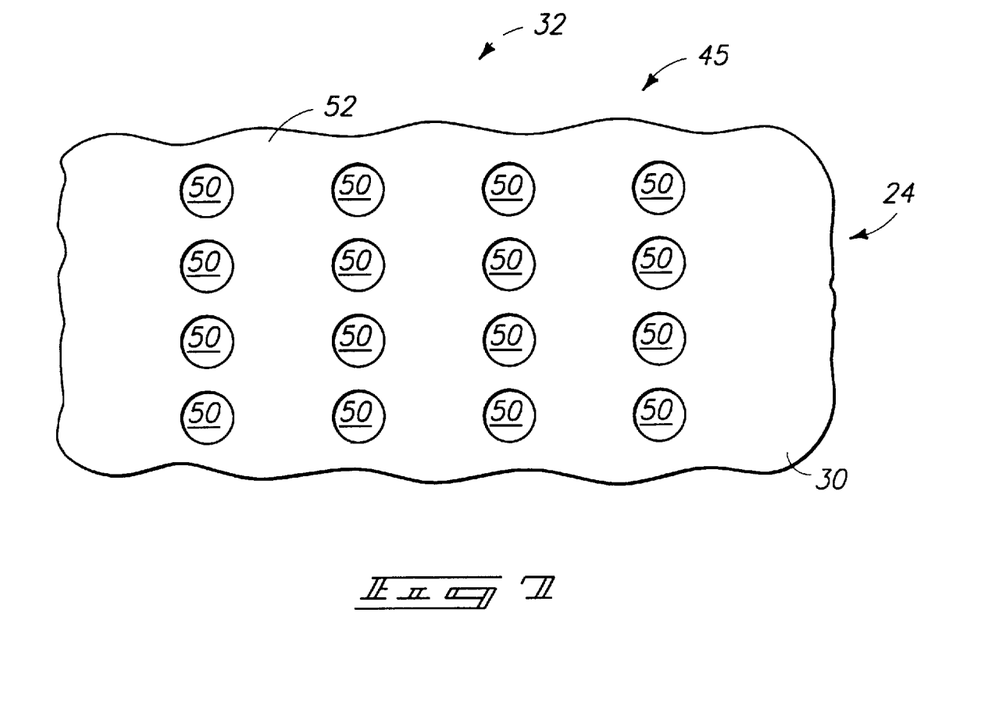
FIG. 7 is a enlarged, fragmentary top view of a portion of the semiconductor wafer fragment of FIG. 4, illustrating a radiation pattern formed across a surface of a photosensitive material associated with the semiconductor fragment.

FIG. 7 illustrates an enlarged fragment 45 of wafer 24 at the processing step of FIG. 4. FIG. 7 shows a section of the patterned region 32, and shows an exemplary first exposure pattern which is formed relative to photosensitive material 30. The exposure pattern of FIG. 7 comprises a number of circular portions 50 which have been exposed to the pattern of the radiation passing through the transparent regions of the reticle, surrounded by a portion 52 that was blocked from exposure to the radiation by the opaque regions of the reticle. The pattern of FIG. 7 corresponds approximately to a pattern which would be obtained by passing radiation through the reticle of FIG. 1. Specifically, the square openings 16 would pattern light into approximately the circular portions 50 due to expected diffraction effects on the light as it passes through openings 16.

In a particular embodiment of the present invention, openings 16 of the FIG. 1 reticle 10 are spaced from one another by about a minimum spacing that can be fabricated into reticle 10 and utilized with a particular desired wavelength of light being passed through the reticle. Accordingly, the patterned portions 50 are spaced from one another by about a minimum feature spacing achievable using the particular fabrication process which forms exposed portions 50. In other words, it is not possible at the time at which exposed portions 50 are formed to reduce the spacing between portions 50 with the particular process utilized to generate the exposed portions. It can be stated that portions 50 are either at the minimum feature spacing achievable by the process utilized to generate the exposed portions, or that the portions are at "about" the minimum feature spacing, with the term "about" indicating that the features 50 are within machine tolerances of the minimum achievable feature spacing (with "machine tolerances" referring to the tolerances of a particular processing machine utilized to hold the reticle and wafer during exposure of photosensitive material 30 to radiation passing through the reticle).

Figure 8:
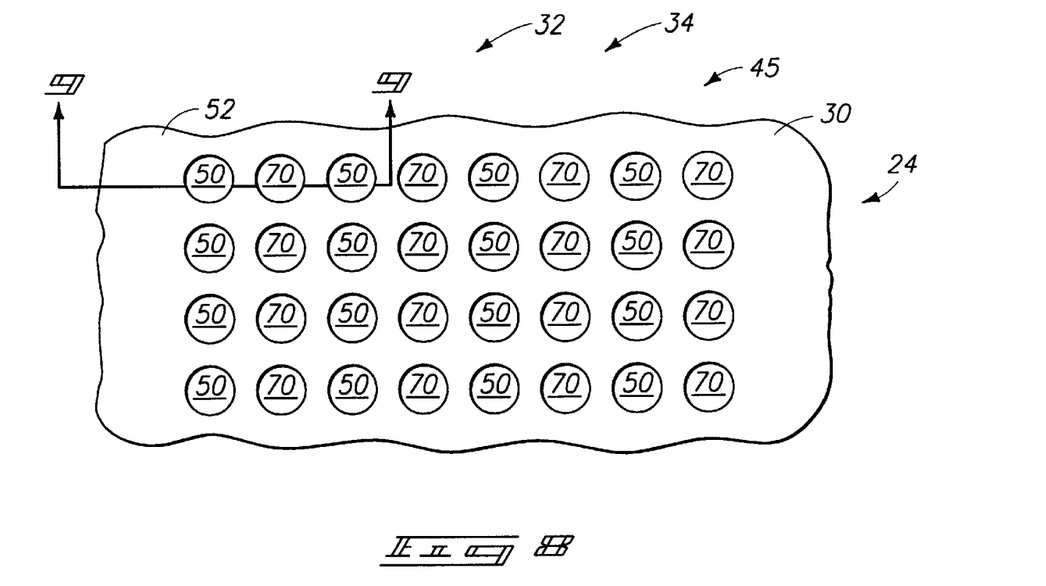
FIG. 8 is a view of the FIG. 7 fragment shown at a processing step subsequent to that of FIG. 7 (specifically, the processing step of FIG. 6), and illustrated with a second radiation pattern overlapping the radiation pattern of FIG. 7.

Referring to FIG. 8, fragment 45 is illustrated at the processing step of FIG. 6, and specifically after second exposure pattern 34 is formed to overlap with the first exposure pattern 32. The second exposure pattern forms exposed portions 70 between the exposed portions 50. Exposed portions 70 are formed utilizing the same reticle that had been used to form exposed portions 50, with such reticle being displaced relative to photosensitive material 30 between the formation of first portions 50 and formation of second portions 70.

In the particular embodiment in which portions 50 were formed to be spaced by a minimum feature spacing of a photolithographic process, it is noted that exposed portions 70 will actually correspond to features identical to those defined by exposed portions 50, and formed between the exposed portions 50. Accordingly, exposed portions 70 define features which are separated from those of exposed portions 50 by less than the minimum feature spacing associated with the photolithographic process. Although the shown embodiment illustrates features 70 as being discreet from features 50, it is to be understood that methodology of the present invention can be utilized to form features with a second exposure pattern which are joined with features formed by a first exposure pattern.

Figure 9:
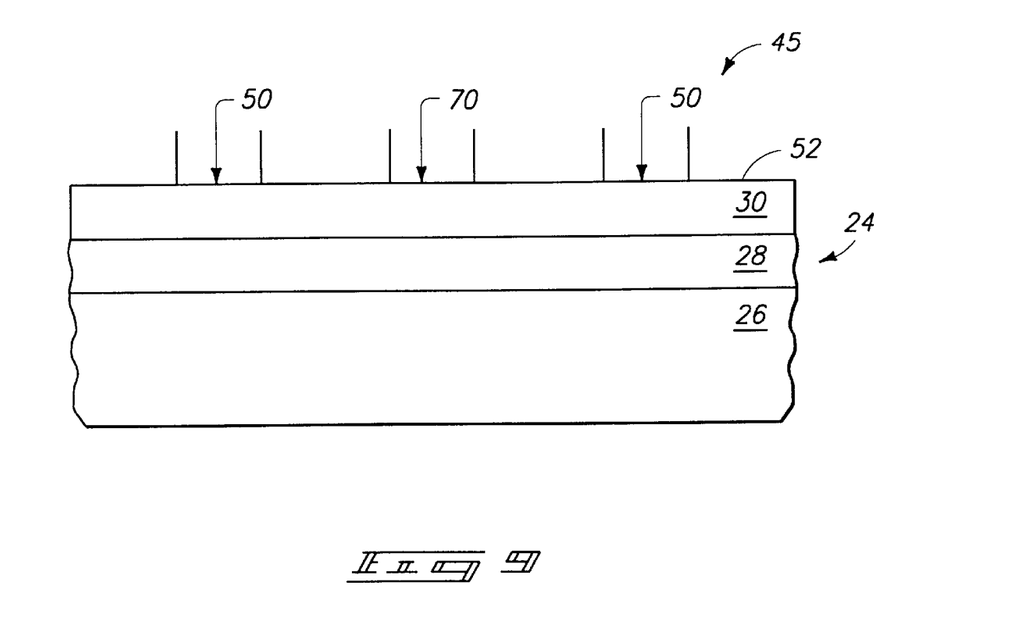
FIG. 9 is a diagrammatic, cross-sectional side view of a portion of the FIG. 8 wafer fragment.

Referring to FIG. 9, a portion of fragment 45 is illustrated in cross-sectional view. Exposed regions 50 and 70 are demarcated in the illustration of FIG. 9.

Figure 10:
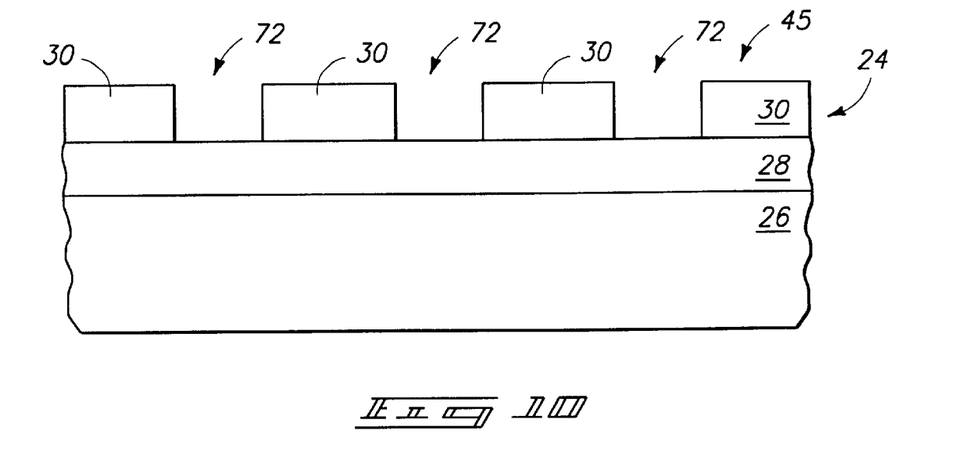
FIG. 10 is a view of the FIG. 9 portion shown at a processing step subsequent to that of FIG. 9.

Referring to FIG. 10, the wafer fragment of FIG. 9 is illustrated after exposed portions 50 and 70 are selectively removed relative to unexposed portions 52 of photosensitive material 30. It is to be understood that depending on whether photosensitive material 30 is a positive or negative material (i.e. a positive or negative photoresist), it can be either exposed portions 50 and 70 that are selectively removed, or unexposed portion 52 that is selectively removed. In the shown embodiment, the selective removal of exposed portions 50 and 70 has formed openings 72 extending downwardly to material 28. After removal of the photoresist from portions 50 and 70, the remaining photosensitive material 30 defines blocks which comprise an outline of portions of semiconductor structures, such as, for example, capacitor structures or DRAM structures.

Figure 11:
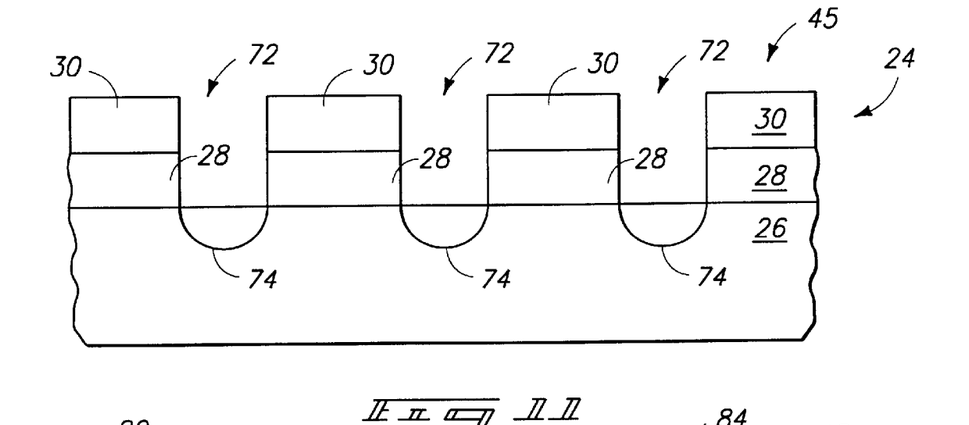
FIG. 11 is a view of the FIG. 9 portion shown at a processing step subsequent to that of FIG. 10.

Referring to FIG. 11, the openings 72 are extended through material 28 by a suitable etching process. Conventional etching processes can be utilized to extend the openings 72 through material 28.

Conductively doped diffusion regions 74 are formed within substrate 26. Diffusion regions 74 can be formed by, for example, implanting one or both of n-type and p-type conductivity-enhancing dopant into a semiconductive substrate 26.

Figure 12:
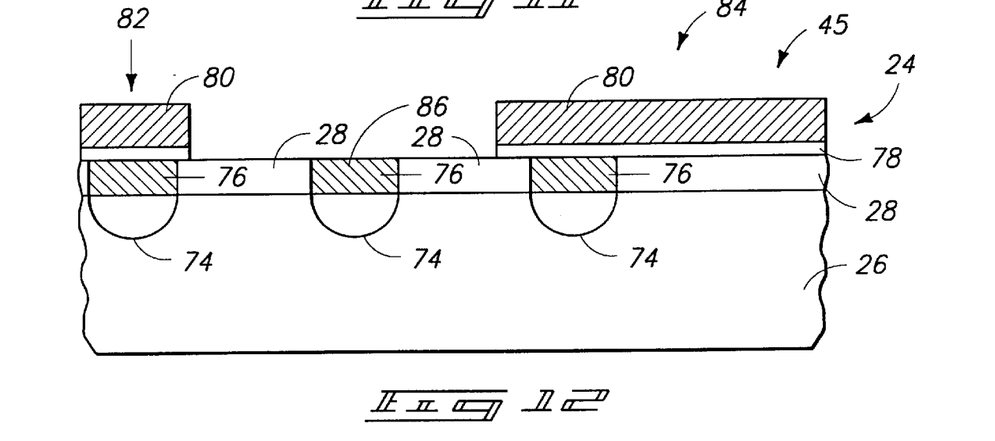
FIG. 12 is a view of the FIG. 9 portion shown at a processing step subsequent to that of FIG. 11.

Referring to FIG. 12, photosensitive material 30 (FIG. 11) is removed and conductive plugs 76 are formed within openings 72 (FIG. 11). Subsequently, dielectric material 78 and a conductive material plate 80 are formed relative to fragment 24 to define capacitor constructions 82 and 84. Also, one of the plugs 76 can be connected to a bit line 86 to form at least a portion of a DRAM cell comprising the capacitors 82 and 84. Such DRAM cell would typically also comprise transistor structures (not shown) connecting pairs of the diffusion regions 74.

An advantage of utilizing methodology of the present invention to form a DRAM cell comprising the construction of FIG. 12 is that various structures associated with the DRAM cell can be formed closer to one another than could otherwise be achieved with a particular photolithographic process.

Figure 13:
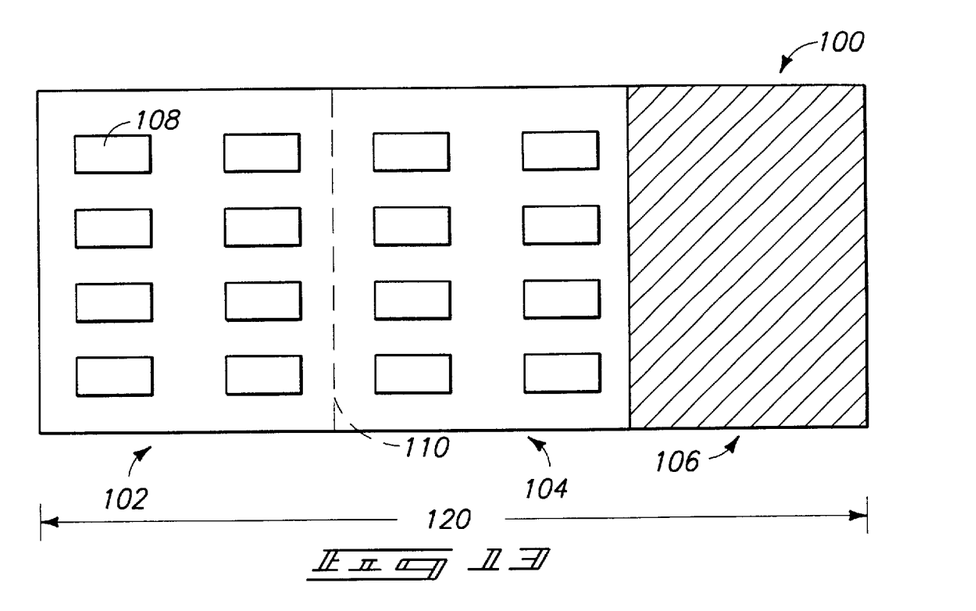
FIG. 13 is a diagrammatic top-view of a reticle formed in accordance with a particular embodiment of the present invention.

The reticle illustrated above with reference to FIG. 1 is but one exemplary reticle that can be utilized with methodology of the present invention. FIG. 13 illustrates a second exemplary reticle 100. Reticle 100 comprises a first region 102, a second region 104, and a third region 106. Regions 102 and 104 have openings 108 extending therein, while region 106 is covered entirely by an opaque material. Regions 102 and 104 are shown separated by a dashed line 110.

Reticle 100 comprises a dimension 120, and each of the regions 102, 104 and 106 comprises about ⅓ of such dimension. Reticle 100 can be utilized in methodology of the present invention by stepping the reticle by a distance of about ⅓ of dimension 120 between repeated exposures of radiation through reticle 100. The region 106 is effectively a blank or opaque region which does not pattern a photosensitive material during exposure of the material to radiation passing through reticle 100. It can be advantageous to include such blank region on a reticle in order to fashion a reticle which fits a particular photolithographic processing machine, and yet which is suitable for forming the repeated and overlapping exposure patterns utilized in methodology of the present invention.

It is noted that opaque region 106 is distinguishable from the opaque regions extending between openings 108, in that opaque region 106 does not overlap with the regions 102 and 104 utilized in forming patterned regions of a photosensitive material. In the shown embodiment, opaque region 106 comprises about ⅓ of a total surface area of reticle 100. A particular size of opaque region 106 can be varied depending on the desired machine to which reticle 100 is to be fitted, as well as depending on the increment that the reticle is to be stepped during formation of overlapping exposure patterns. In particular embodiments, opaque region 106 can comprise at least about 20% of an area of reticle 100, and in other embodiments can comprise at least about 30% of an area of the reticle. In yet other embodiments, opaque region 106 can comprise about the same area as the portion of the reticle utilized in defining an exposure pattern.

Figure 14:
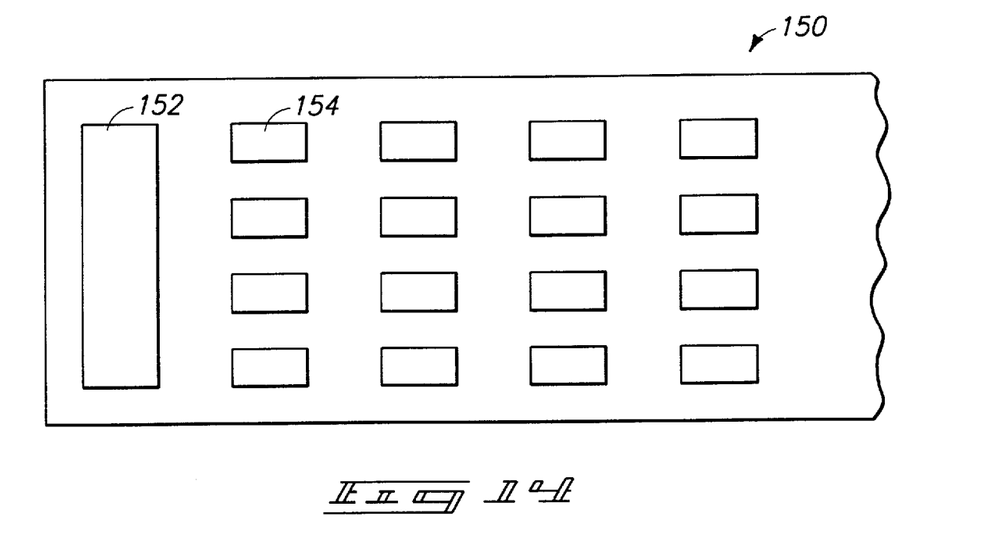
FIG. 14 is a diagrammatic top-view of a reticle formed in accordance with another embodiment of the present invention.

Referring to FIG. 14, a reticle 150 is illustrated showing yet another embodiment which can be utilized in processing of the present invention. Reticle 150 comprises two types of openings formed therein. A first of the opening types is illustrated as opening 152, and a second of the opening types is illustrated as openings 154 (with only one of the openings 154 being labeled). Openings 154 define a pattern which consists of a unit feature (a single opening 154) which is repeated a plurality of times, while opening 152 defines a pattern which is repeated less than the number of times that unit feature 154 is repeated, and in the shown embodiment the unit feature corresponding to opening 152 is formed only once.

Figure 15:
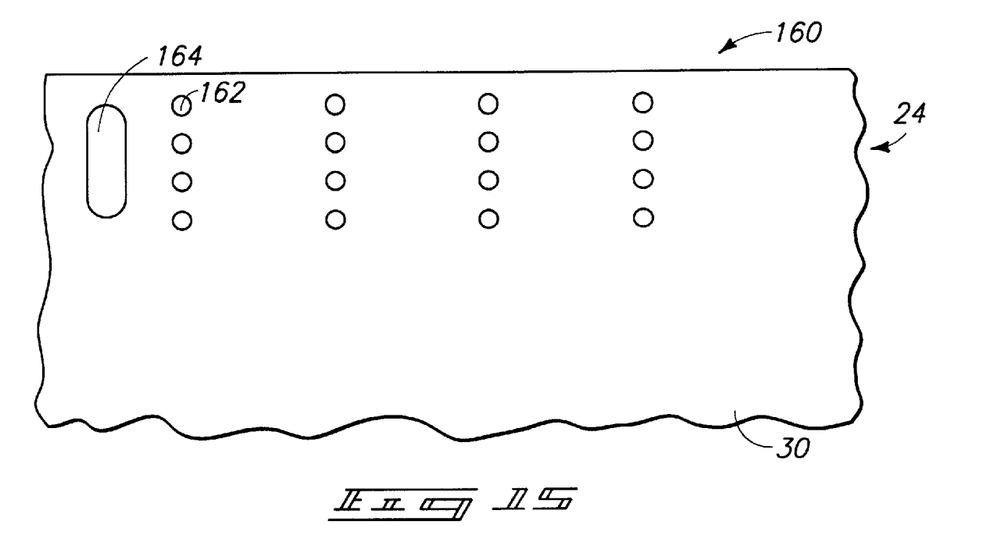
FIG. 15 is a diagrammatic top-view of a photosensitive material illustrating a pattern formed in the material by exposure to radiation passed through the reticle of FIG. 14.

Referring to FIG. 15, a fragment 160 of wafer 24 is illustrated after exposure of photosensitive material 30 to light patterned with reticle 150. Such exposure defines features 162 corresponding to radiation passing through openings 154 (FIG. 14) and a feature 164 corresponding to light passing through opening 152 (FIG. 14). Features 162 (only one of which is labeled) define a pattern which consists of the unit feature 162 repeated a plurality of times. In contrast, feature 164 is not repeated across the shown pattern formed from a single exposure of radiation through reticle 150 (FIG. 14).

Figure 16:
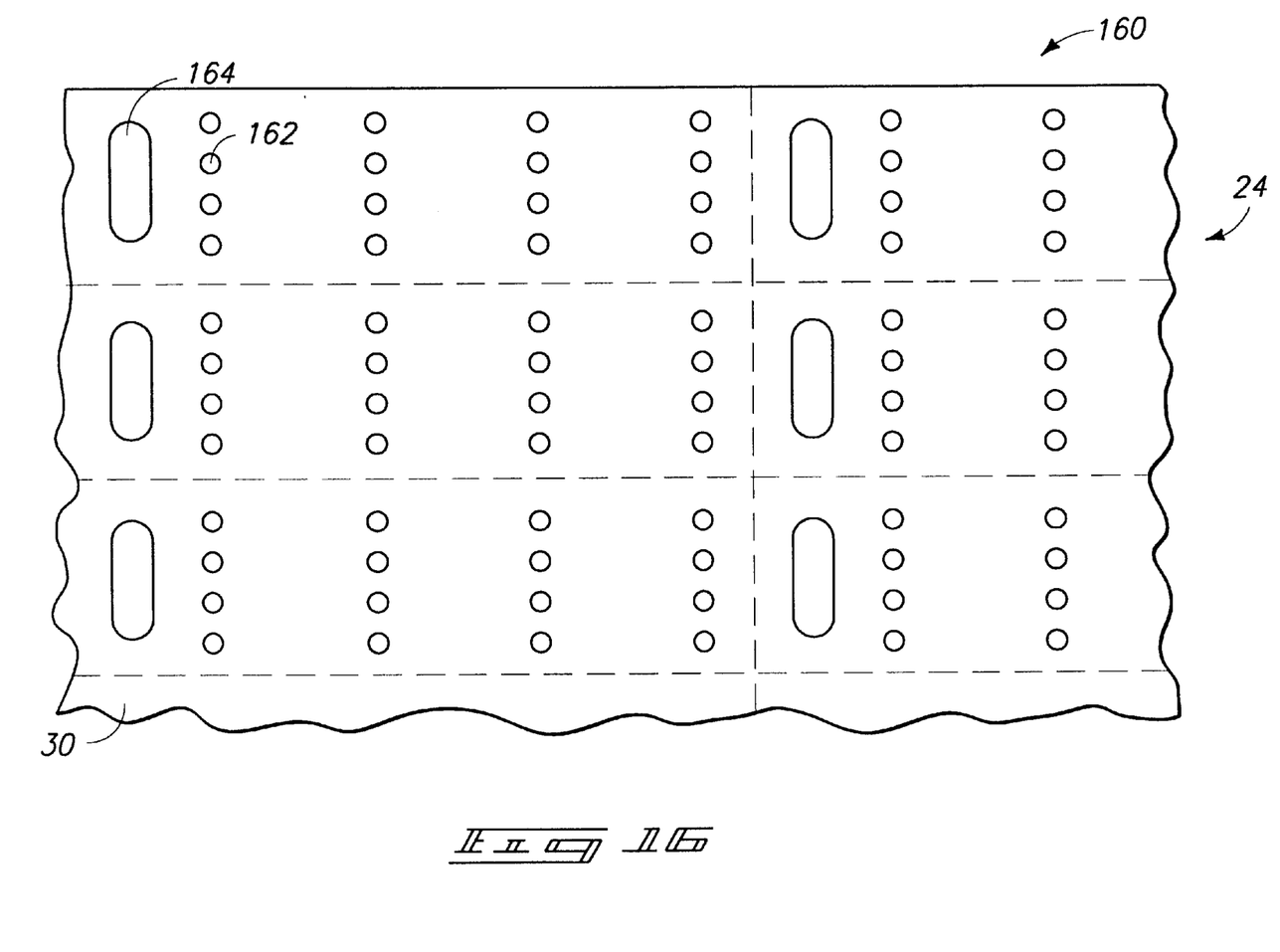
FIG. 16 is a view of the FIG. 15 fragment shown at a processing step subsequent to that of FIG. 15, and specifically shown after additional patterns have been formed across a surface of the photosensitive material by subsequent exposures to radiation passed through the FIG. 14 reticle.

FIG. 16 illustrates fragment 160 after multiple non-overlapping exposure patterns are formed with reticle 150. The non-overlapping exposure patterns are delineated relative to one another by dashed line separators shown in FIG. 16.

Figure 17:
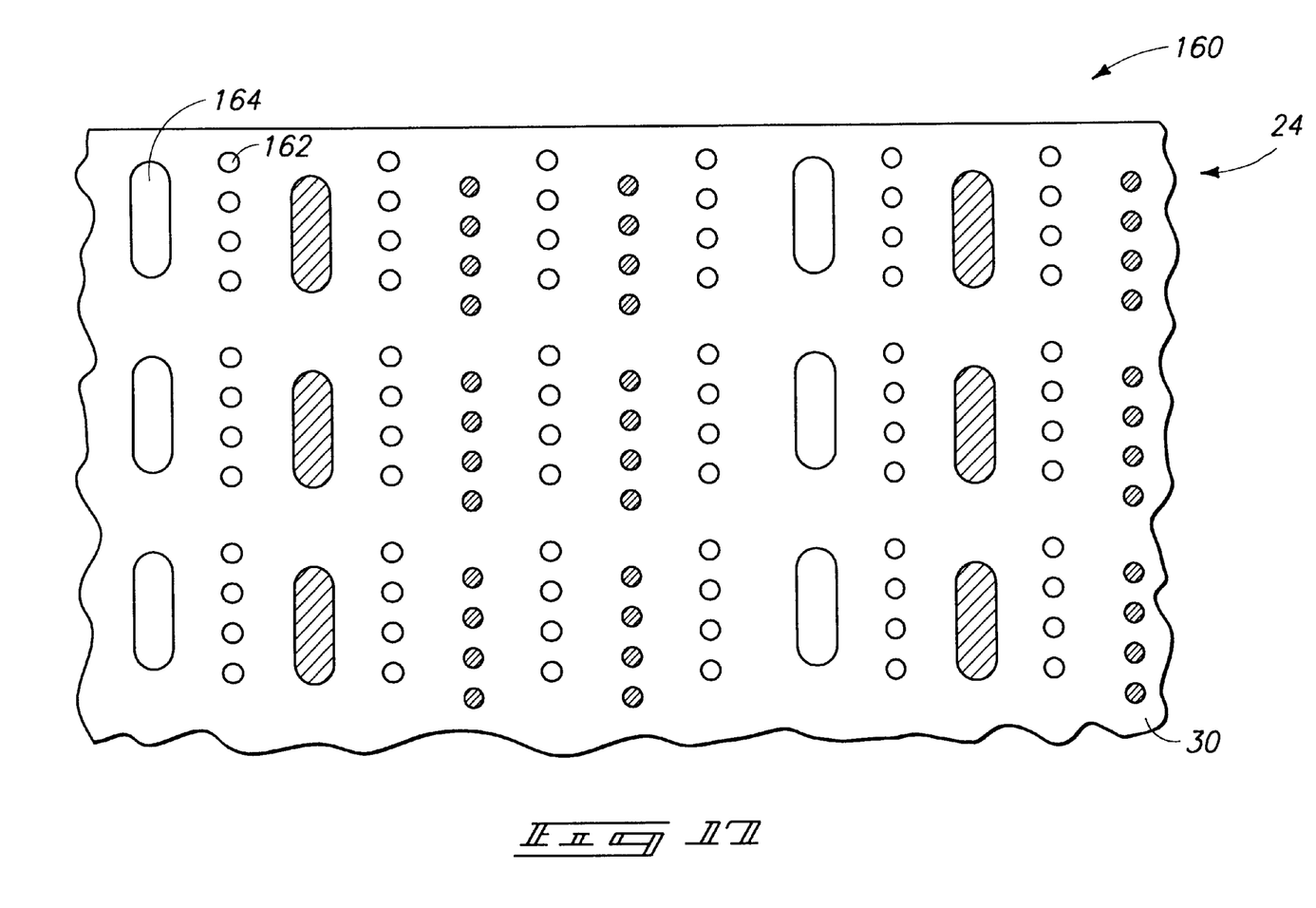
FIG. 17 is a view of the FIG. 15 fragment shown at a processing step subsequent to that of FIG. 16, and specifically shown after additional patterns of radiation are formed across a surface of the fragment by additional exposures to radiation patterned by the reticle of FIG. 14.

Referring to FIG. 17, fragment 160 is illustrated after a plurality of overlapping exposure patterns are formed relative to the non-overlapping exposure patterns of FIG. 16. The overlapping exposure patterns are shown with cross-hatching to distinguish them from the non-overlapping exposure patterns. It is noted that reticle 150 (FIG. 14) has been displaced relative to photosensitive material 30 both longitudinally and latitudinally to form the illustrated overlapping patterns. Further, it is noted that the features 164 are repeated less frequently in the overlapping patterns than are the features 162. The utilization of frequently repeated features and less frequently repeated features can be advantageous for forming particular semiconductor constructions. For instance, it can be desired to utilize a frequently repeating feature for memory arrays, while utilizing a less frequently repeating feature to ultimately define portions of peripheral circuitry.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A photolithographic method comprising:

providing a semiconductor substrate having a photosensitive material thereover;

passing electromagnetic radiation through a reticle to form a first pattern of the radiation on the photosensitive material; the reticle having a first dimension along a first axis;

displacing the reticle relative to the semiconductor substrate along the first axis by an increment less than the first dimension of the reticle;

after the displacing, passing the electromagnetic radiation through the reticle to form a second pattern of the radiation on the photosensitive material; and wherein the reticle comprises a first portion that defines the first pattern and second portion which is opaque to the radiation; the second portion having an area that is at least about 20% of the area of the reticle.

2. The method of claim 1 wherein the second portion has an area that is at least about 30% of the area of the reticle.

3. The method of claim 1 wherein the first portion is about equal in area to the second portion.

4. The method of claim 1 wherein the first and second patterns of radiation on the photosensitive material comprise regions of the photosensitive material exposed to the radiation and regions of the photosensitive material not exposed to the radiation; the method further comprising selectively removing either the exposed or unexposed regions of the photosensitive material to pattern the photoresist material into blocks.

5. The method of claim 4 wherein at least some portions of the combined first and second regions define portions of capacitor structures, wherein at least some of the blocks comprise an outline of the portions of the capacitor structures, and further comprising transferring the outline to at least a portion of the semiconductor substrate underlying the photosensitive material to form the portions of the capacitor structures.

* * * * *

UNITED STATES PATENT AND TRADEMARK OFFICE
CERTIFICATE OF CORRECTION

PATENT NO.    : 6,670,109 B2
DATED         : December 30, 2003
INVENTOR(S)   : John F. Van Itallie et al.

It is certified that error appears in the above-identified patent and that said Letters Patent is hereby corrected as shown below:

Column 4,
Line 25, replace "assembly 18 described with reference to FIG. 3. Further,"
with -- assembly 18 described with reference to FIG. 2. Further, --

Column 6,
Line 52, replace "shown embodiment illustrates features 70 as being discreet"
With -- shown embodiment illustrates features 70 as being discrete --

Signed and Sealed this

Twenty-seventh Day of July, 2004

JON W. DUDAS
*Acting Director of the United States Patent and Trademark Office*